United States Patent
Yoshikawa et al.

(10) Patent No.: US 9,318,307 B2
(45) Date of Patent: Apr. 19, 2016

(54) ZINC OXIDE SPUTTERING TARGET AND METHOD FOR PRODUCING SAME

(71) Applicant: NGK INSULATORS, LTD., Nagoya-Shi (JP)

(72) Inventors: Jun Yoshikawa, Nagoya (JP); Katsuhiro Imai, Nagoya (JP); Koichi Kondo, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 14/305,267

(22) Filed: Jun. 16, 2014

(65) Prior Publication Data

US 2014/0328747 A1  Nov. 6, 2014

Related U.S. Application Data

(63) Continuation of application No. PCT/JP2013/050905, filed on Jan. 18, 2013.

(30) Foreign Application Priority Data

Jan. 30, 2012 (JP) ................................. 2012-016456
Sep. 25, 2012 (JP) ................................. 2012-211222

(51) Int. Cl.
| | |
|---|---|
| *H01J 37/00* | (2006.01) |
| *H01J 37/34* | (2006.01) |
| *C04B 35/453* | (2006.01) |
| *C23C 14/08* | (2006.01) |
| *C23C 14/34* | (2006.01) |
| *B32B 18/00* | (2006.01) |
| *C04B 35/626* | (2006.01) |
| *C04B 35/634* | (2006.01) |
| *C04B 35/638* | (2006.01) |
| *C04B 37/02* | (2006.01) |
| *C01G 9/02* | (2006.01) |
| *C04B 35/64* | (2006.01) |
| *C04B 111/00* | (2006.01) |

(52) U.S. Cl.
CPC ............. *H01J 37/3426* (2013.01); *B32B 18/00* (2013.01); *C01G 9/02* (2013.01); *C04B 35/453* (2013.01); *C04B 35/6261* (2013.01); *C04B 35/634* (2013.01); *C04B 35/638* (2013.01); *C04B 35/64* (2013.01); *C04B 37/026* (2013.01); *C23C 14/086* (2013.01); *C23C 14/3414* (2013.01); *C04B 2111/0037* (2013.01); *C04B 2235/5292* (2013.01); *C04B 2235/549* (2013.01); *C04B 2235/5445* (2013.01); *C04B 2235/6025* (2013.01); *C04B 2235/786* (2013.01); *C04B 2235/787* (2013.01); *C04B 2235/788* (2013.01); *C04B 2235/9607* (2013.01); *C04B 2237/12* (2013.01); *C04B 2237/34* (2013.01); *C04B 2237/407* (2013.01); *H01J 2237/081* (2013.01)

(58) Field of Classification Search
None
See application file for complete search history.

(56) References Cited

U.S. PATENT DOCUMENTS

| | | | |
|---|---|---|---|
| 5,236,632 A * | 8/1993 | Ogawa et al. ............... | 252/519.5 |
| 6,417,127 B1 | 7/2002 | Yamamoto et al. | |
| 2008/0290316 A1 | 11/2008 | Katayama et al. | |
| 2009/0101493 A1 * | 4/2009 | Nakayama et al. ...... | 204/192.11 |

FOREIGN PATENT DOCUMENTS

| | | | |
|---|---|---|---|
| JP | 51-016318 A | | 2/1976 |
| JP | 05-139704 A | | 6/1993 |
| JP | 11-279755 | * | 10/1999 |
| JP | 3128861 B | | 11/2000 |
| JP | 2001-322866 A | | 11/2001 |
| JP | 2002-121067 A | | 4/2002 |
| JP | 3301755 B | | 4/2002 |
| JP | 2004-006847 A | | 1/2004 |
| JP | 2006-264316 A | | 10/2006 |
| JP | 2009-215629 A | | 9/2009 |
| JP | 2010-030855 A | | 2/2010 |
| JP | 2011-084765 A | | 4/2011 |
| JP | 2011-179056 A | | 9/2011 |
| WO | 2007/094115 A1 | | 8/2007 |

OTHER PUBLICATIONS

Translation of Japan 11-279755, Oct. 1999.*
International Preliminary Report on Patentability (with English Translation), International Application No. PCT/JP2013/050905, dated Aug. 5, 2014 (13 pages).
International Search Report and Written Opinion (with English Translation), International Application No. PCT/JP2013/050905, dated Apr. 23, 2013 (15 pages).

* cited by examiner

*Primary Examiner* — Steven Bos
(74) *Attorney, Agent, or Firm* — Burr & Brown, PLLC

(57) ABSTRACT

Provided is a zinc oxide sputtering target, which can effectively suppress the occurrence of break or crack in the target during sputtering to enable production of a zinc oxide transparent conductive film with high productivity. The zinc oxide sputtering target is composed of a zinc oxide sintered body comprising zinc oxide crystal grains, wherein the zinc oxide sputtering target has a sputter surface having a (100) crystal orientation degree of 50% or more.

11 Claims, 2 Drawing Sheets

ZINC OXIDE SPUTTERING TARGET AND METHOD FOR PRODUCING SAME

CROSS-REFERENCE TO RELATED APPLICATIONS

This application is a continuation application of PCT/JP2013/050905 filed Jan. 18, 2013, which claims priorities to Japanese Patent Application No. 2012-16456 filed Jan. 30, 2012 and Japanese Patent Application No. 2012-211222 filed Sep. 25, 2012, the entire contents of all of which are incorporated herein by reference.

BACKGROUND OF THE INVENTION

1. Field of the Invention

The present invention relates to a zinc oxide sputtering target and a method for producing the same.

2. Description of the Related Art

For a transparent conductive film used in electronic devices and the like, indium tin oxide (ITO) and the like have been widely used over many years. However, in view of the situation where the prices of rare earth metals such as indium have soared in recent years, rare metal alternatives are strongly desired. Recent vigorous attempts to prepare a transparent conductive film with less expensive zinc oxide (ZnO) have not genuinely come into practical use as having various problems such as failure to attain a desired conductivity due to difficulty in sufficiently lowering electrical resistivity.

Meanwhile, it is the industrial mainstream that a transparent conductive film is produced by sputtering. A sputtering target reaches a high temperature during sputtering, hence the sputtering target is cooled by a backing plate having water channels inside. Thus, a temperature difference between the sputter surface exposed to a high temperature and the water-cooled backing plate surface tends to generate heat stress inside the sputtering target, which may cause cracks in the sputtering target.

Patent Document 1 (JP2009-215629A) discloses that generation of cracks can be suppressed if a coefficient of linear thermal expansion in the direction perpendicular to the sputter surface of the target is more than 10% greater than that in the direction parallel the sputter surface. However, the effect of suppressing the occurrence of cracks was not sufficient when the power supply was increased for achieving higher productivity during sputtering.

Patent Document 2 (JP3128861B) and Patent Document 3 (JP3301755B) disclose a sputtering target composed of a zinc oxide sintered body. Although these documents disclose that the quality of the sputtered film can be improved by having zinc oxide oriented along with the (101) or (002) plane, such improvement was not intended to suppress the occurrence of cracks in the target.

CITATION LIST

Patent Documents

Patent Document 1: JP 2009-215629A
Patent Document 2: JP 3128861B
Patent Document 3: JP 3301755B

SUMMARY OF THE INVENTION

The inventors have currently found that allowing a zinc oxide sputtering target to have a sputter surface with a (100) crystal orientation degree of 50% or more makes it possible to effectively suppress the occurrence of break or crack in the target during sputtering, and thus enables production of a zinc oxide transparent conductive film with high productivity. Thus, an object of the present invention is to provide a zinc oxide sputtering target, which can effectively suppress the occurrence of break or crack in the target during sputtering to enable production of a zinc oxide transparent conductive film with high productivity.

According to an aspect of the present invention, there is provided a zinc oxide sputtering target composed of a zinc oxide sintered body comprising zinc oxide crystal grains, wherein the zinc oxide sputtering target has a sputter surface having a (100) crystal orientation degree of 50% or more.

According to another aspect of the present invention, there is provided a method for producing a zinc oxide sputtering target comprising the steps of:

providing a plate-like zinc oxide powder having a mean volume particle diameter D50 of 0.1 to 1.0 μm;

orienting the plate-like zinc oxide powder through a method utilizing shearing stress to obtain a crystallographically oriented green compact; and firing the crystallographically oriented green compact at a firing temperature of 1000 to 1400° C. to obtain a zinc oxide sintered body comprising zinc oxide crystal grains that are oriented.

According to another aspect of the present invention, there is provided is a zinc oxide transparent conductive film obtained by sputtering using the sputtering target according to any one of the above aspects.

DETAILED DESCRIPTION OF THE INVENTION

Zinc Oxide Sputtering Target

Figure 1:
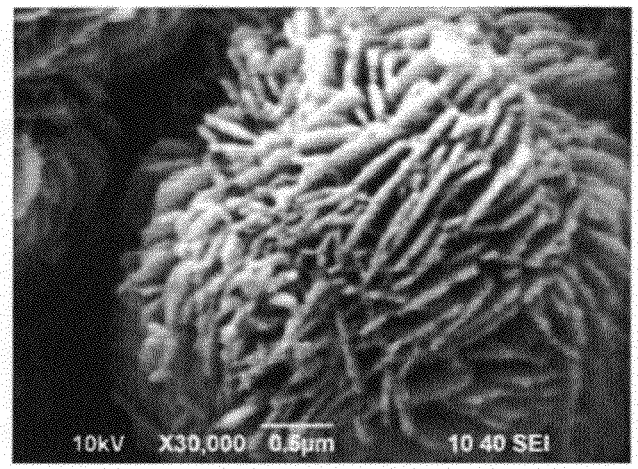
FIG. 1 is an SEM image of spherical secondary particles containing aggregated plate-like zinc oxide primary particles prepared in Example 1.

The zinc oxide sputtering target of the present invention is composed of a zinc oxide sintered body comprising zinc oxide crystal grains, and has a sputter surface having a (100) crystal orientation degree of 50% or more, preferably 75% or more, and more preferably 90% or more. In this way, orienting the (100) crystal plane of zinc oxide parallel to the sputter surface can effectively suppress the occurrence of break or crack in the target during sputtering to enable production of a zinc oxide transparent conductive film with high productivity.

Specifically, zinc oxide crystal has a hexagonal wurtzite structure, of which the coefficient of thermal expansion in the c-axis direction is $4.5 \times 10^{-6}$/° C., which is lower than $7.8 \times 10^{-6}$/° C. in the a-axis direction. Since the (100) crystal plane of zinc oxide is a plane that is parallel to the c-axis direction of the crystal, increasing the (100) crystal orientation degree in the sputter surface to as high as 50% or more allows the c-axis, which has a coefficient of thermal expansion that is lower than that of the a-axis, to be oriented parallel to the in-plane direction of the sputter surface. On the other hand, during sputtering, a temperature difference between the sputter surface exposed to a high temperature and the water-cooled backing plate surface tends to generate heat stress inside the sputtering target, and this heat stress also occurs in the in-plane direction of the sputter surface. This is because the sputtered side of the target leads to a large thermal expansion due to a high temperature, while the other side of the target facing the backing plate leads to a small thermal expansion due to a low temperature, and such difference generates distortion in the in-plane direction of the sputter surface. No such heat stress occurs in the thickness direction of the target. Thus, orienting the (100) plane of the zinc oxide crystal parallel to the sputter surface allows the c-axis, which has a coefficient of thermal expansion that is lower than that of the a-axis, to be oriented parallel to the in-plane direction of the sputter surface, along which heat stress occurs, and thus to reduce the thermal expansion in the in-plane direction of the sputter surface, which may be a cause of break or crack.

The zinc oxide sintered body comprises zinc oxide crystal grains. That is, the zinc oxide sintered body is a solid object in which a plurality of zinc oxide crystal grains bond together by sintering. The zinc oxide crystal grains are grains comprising zinc oxide, and may also comprise, as other elements, a dopant such as Al and Ga belonging to the Group 3B elements and the like, and inevitable impurities, or may be composed of zinc oxide and inevitable impurities. Such other elements may be substituted for Zn or O site of the hexagonal wurtzite structure, may be included as an additive element which does not constitute the crystal structure, or may exist at a grain boundary. The zinc oxide sintered body may also comprise another phase or another element as described above in addition to zinc oxide crystal grains, but is preferably composed of zinc oxide crystal grains and inevitable impurities.

The zinc oxide sintered body of the present invention has a sputter surface having a (100) crystal orientation degree of 50% or more, preferably 75% or more, and more preferably 90% or more. The higher degree of the (100) crystal orientation in the sputter surface can more effectively reduce heat stress in the in-plane direction of the target, which may be a cause of break or crack. Therefore, an upper value of degree of the (100) crystal orientation in the sputter surface should not be particularly limited and is ideally 100%. The value of the (100) crystal orientation degree can be determined by using an XRD equipment (e.g., product name "RINT-TTR III" manufactured by Rigaku Corporation) to measure an XRD profile upon X-ray irradiation on a surface of a zinc oxide sintered body in a disk-shaped form. The value of F representing the (100) crystal orientation degree is calculated by the following formulae.

$$F = \frac{p - p_0}{1 - p_0}$$ [Formula 1]

$$p_0 = \frac{I_0(100)}{I_0(100) + I_0(002) + I_0(101) + I_0(102)}$$

$$p = \frac{I_s(100)}{I_s(100) + I_s(002) + I_s(101) + I_s(102)}$$

($I_0$(hkl) and $I_s$(hkl) respectively represent diffraction intensities from (hkl) planes (integrated value) in ICDD No. 361451 and a sample.

The zinc oxide crystal grains preferably have an aspect ratio of 2.0 or lower, more preferably 1.5 or lower, and further preferably 1.3 or lower in a cross section perpendicular to the sputter surface. This aspect ratio is a ratio of (a length parallel to the sputter surface)/(a length perpendicular to the sputter surface). With this ratio being closer to 1, the anisotropy is more reduced to come closer to the isotropy and thus makes delamination upon orientation less likely to occur between crystal faces so as to enhance the strength, thereby contributing to suppression of break or crack. This aspect ratio can be determined in the following manner. That is, a cubic-shaped sample of which the one side is 5 mm is cut out from a zinc oxide sintered body in a disk-shaped form (a sputtering target). After polishing a surface perpendicular to the disk plane and etching it with 0.3 M nitric acid for 10 seconds, an image of the sample is taken by a scanning electron microscope. The visual field range is chosen in such a manner that any straight lines, when drawn parallel and perpendicular to the disk plane, intersect 10 to 30 grains. In 3 straight lines drawn parallel to the disk plane, an average length of line segment passing through each grain is calculated in all grains that the straight lines intersect, and then is multiplied by 1.5 to give a value of $a_1$. Similarly, in 3 straight lines drawn perpendicular to the surface of the disk plane, an average length of line segment passing through each grain is calculated in all grains that the straight lines intersect, and then is multiplied by 1.5 to give a value of $a_2$. The aspect ratio is given as a value of $a_1/a_2$.

The zinc oxide crystal grains preferably have an average grain diameter of 1 to 50 μm, more preferably 2 to 35 μm, further preferably 3 to 20 μm, and most preferably 3 to 10 μm. Having such an average grain diameter sufficiently reduces the aspect ratio of the zinc oxide crystal grains and increases the strength of the sintered body, making it possible to suppress break or crack more effectively. The average grain diameter can be determined in the following manner. That is, a cubic-shaped sample of which the one side is 5 mm is cut out from a zinc oxide sintered body in a disk-shaped form (a sputtering target). After polishing a surface perpendicular to the disk plane and etching it with 3M nitric acid for 10 seconds, an image of the sample is taken by a scanning electron microscope. The visual field range is chosen in such a manner that any straight lines, when drawn parallel and perpendicular to the disk plane, intersect 10 to 30 grains. In 3 straight lines drawn parallel to the surface of the disk plane, an average length of line segment passing through each grain is calculated in all grains that the straight lines intersect, and then be multiplied by 1.5 to give a value of $a_1$. Similarly, in 3 straight lines drawn perpendicular to the disk plane, an average length of line segment passing through each grain is calculated in all grains that the straight lines intersect, and then be multiplied by 1.5 to give a value of $a_2$. The average grain diameter is given as a value of $(a_1+a_2)/2$.

Production Method

The zinc oxide sputtering target of the present invention as described above may be produced in the following manner.

The first step is to provide a plate-like zinc oxide powder having a mean volume particle diameter D50 of 0.1 to 1.0 μm, preferably 0.3 to 0.8 μm. The mean volume particle diameter D50 can be measured by a laser diffraction particle size analyzer. As such, the production method of the present invention is characterized by using a plate-like raw powder having fine particles at the sub-micron level.

Conventionally, an oriented sintered body was produced by using a plate-like raw powder with a diameter of several μm and orienting the plate-like particles through a press molding or the like (e.g., see Patent Document 1). However, the oriented sintered body produced in such method usually has a high aspect ratio in crystal grains, which in turn reduces the in-plane strength and tends to generate break or crack due to heat stress. That is, according to the findings of the present inventors, if the plate-like coarse raw powder with a diameter of several μm is used, the aspect ratio in crystal grains of the sintered body hardly changes over grain growth and the degree of anisotropy tends to remain high. In contrast, in the present invention, by using the plate-like raw powder having fine particles of the sub-micron level as described above and employing an orientation technique utilizing shearing stress, it is possible to obtain a sintered body with high orientation degree even from a fine raw material. Furthermore, by allowing the plate-like raw powder having fine particles of the sub-micron level to undergo grain growth during sintering (preferably to 3 µm or more), the aspect ratio of the crystal grains in the sintered body becomes low, the degree of anisotropy is significantly reduced, and break or crack is effectively suppressed.

Such plate-like raw powder having fine particles of the sub-micron level may be produced through any method, but can be preferably obtained by adding an alkali aqueous solution to a zinc salt aqueous solution, stirring the mixture at a temperature of 60 to 95° C. for 2 to 10 hours to form a precipitate, and subjecting the precipitate to washing, drying and pulverization. The zinc salt aqueous solution may be any aqueous solution containing a zinc ion, but is preferably an aqueous solution of zinc salt such as zinc nitrate, zinc chloride, and zinc acetate. The alkali aqueous solution is preferably an aqueous solution of sodium hydroxide, potassium hydroxide, or the like. Although the concentrations of the zinc salt aqueous solution and the alkali aqueous solution and the mixture ratio thereof are not particularly limited, it is preferable to mix the same molar concentrations of the zinc salt aqueous solution and the alkali aqueous solution in the same volume ratio. It is preferable to wash the precipitate with ion-exchanged water a plurality of times. The alkali aqueous solution is more preferred to be an aqueous solution of a nitrogen-containing basic organic compound such as tetramethyl ammonium hydroxide, tetraethyl ammonium hydroxide, and guanidine since it becomes possible to suppress contamination with an element of the alkali metal group or an element of the alkaline earth group. The washed precipitate is dried preferably at a temperature of 100 to 300° C. The dried precipitate is in the form of spherical secondary particles containing aggregated plate-like zinc oxide primary particles, and thus is preferred to be subjected to a pulverization process. The pulverization is preferably carried out in a ball mill for 1 to 10 hours with a solvent such as ethanol added to the washed precipitate. The pulverization provides a plate-like zinc oxide powder as primary particles.

The plate-like zinc oxide powder is oriented through a technique utilizing shearing stress to form a crystallographically oriented green compact. During this process, the plate-like zinc oxide powder may be added with another element or constituent such as a metal oxide powder (e.g., an α-$Al_2O_3$ powder) as a dopant. Preferable examples of the technique utilizing shearing stress include a tape casting, an extrusion molding, a doctor blade method, and any combinations thereof. The orientation technique utilizing shearing stress, in any method as described above, is preferred to be conducted by preparing a slurry from the plate-like zinc oxide powder with suitable addition of an additive such as a binder, a plasticizer, a dispersant and a dispersion medium, and passing the resulting slurry through a thin slit-like discharge port so as to be discharged and molded in a sheet-like form on a substrate. The width of the slit-like discharge port is preferably 10 to 400 µm. The amount of the dispersion medium in use is preferably adjusted to bring the slurry viscosity to 5000 to 100000 cP, more preferably 20000 to 60000 cP. The thickness of the crystallographically oriented green compact in a sheet-like form is preferably 5 to 500 µm, more preferably 10 to 200 µm. It is preferable that a plurality of the crystallographically oriented green compacts in a sheet-like form are stacked on top of each other to provide a precursor laminate having a desired thickness, which is subjected to a press molding. This press molding can be preferably carried out by packing the precursor laminate in a way such as vacuum pack and subjecting the packed precursor laminate to an isostatic pressing in hot water of 50 to 95° C. at a pressure of 10 to 2000 kgf/cm$^2$. In the case of using an extrusion molding, sheet-like green compacts, which have passed through a thin discharge port in a mold, may be unified in the mold so as to be discharged in a laminated form, in accordance with the design of a flow path in the mold. The green compacts thus obtained are preferably degreased according to the well-known conditions.

The crystallographically oriented green compacts obtained as described above are fired at a firing temperature of 1000 to 1400° C., preferably 1100 to 1350° C. to form a zinc oxide sintered body comprising zinc oxide crystal grains that are oriented. The firing time period at the above firing temperature is not particularly limited but is preferably 1 to 10 hours, and more preferably 2 to 5 hours. The zinc oxide sintered body thus obtained has a high (100) crystal orientation degree in the sputter surface, preferably 50% or more, and typically has crystal grains with an aspect ratio of 2.0 or lower in a cross section perpendicular to the sputter surface.

EXAMPLES

Example 1

Figure 2:
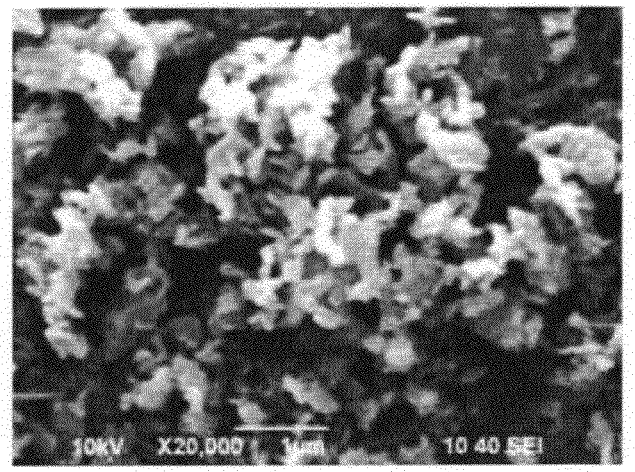
FIG. 2 is an SEM image of plate-like primary particles after ball mill crushing prepared in Example 1.

A zinc oxide powder as a raw material was prepared in the following manner. Zinc nitrate hexahydrate (manufactured by Kanto Chemical Co., Inc.) was used to prepare an aqueous solution of 0.1 M $Zn(NO_3)_2$. Also, sodium hydroxide (manufactured by Sigma-Aldrich Co., Inc.) was used to prepare an aqueous solution of 0.1 M NaOH. The $Zn(NO_3)_2$ aqueous solution was added to the NaOH aqueous solution in the ratio of 1:1 by volume, and the resulting mixture was stirred at a temperature of 80° C. for 6 hours to yield a precipitate. The precipitate was washed three times with ion-exchanged water and dried to obtain spherical secondary particles containing aggregated plate-like zinc oxide primary particles. FIG. 1 shows an image of the resulting secondary particles taken by an electron microscope. Subsequently, $ZrO_2$ balls with a diameter of 2 mm were used with ethanol as a solvent to perform ball milling pulverization for 3 hours so as to pulverize the zinc oxide secondary particles shown in FIG. 1 into plate-like primary particles having a mean volume particle diameter D50 of 0.6 µm. FIG. 2 shows an image of the resulting plate-like primary particles taken by an electron microscope.

The resulting plate-like zinc oxide primary particles in an amount of 100 parts by weight were mixed with a binder (polyvinyl butyral: product No. BM-2, manufactured by Sekisui Chemical Co., Ltd.) in an amount of 15 parts by weight, a plasticizer (DOP: di-(2-ethylhexyl)phthalate, manufactured by Kurogane Kasei Co., Ltd.) in an amount of 6.2 parts by weight, a dispersant (product name: Rheodol SP-030, manufactured by Kao Corporation) in an amount of 3 parts by weight, and a dispersion medium (2-ethylhexanol). The amount of the dispersion medium in use was adjusted to bring the slurry viscosity to 10000 cP. The slurry thus obtained was subjected to a doctor blade method to form on a PET film a sheet having a thickness of 20 µm after dried. The resulting tape was cut into a circle with a diameter of 140 mm and 500 pieces of the cut tapes were stacked on top of each other, and then placed on an aluminum plate with a thickness of 10 mm to be sealed into a vacuum pack. The vacuum pack was subjected to isostatic pressing in hot water of 85° C. at a pressure of 100 kgf/cm² to provide a disk-shaped green compact. The disk-shaped green compact was placed in a degreasing furnace, in which degreasing was conducted at a temperature of 600° C. for 20 hours. The degreased body thus obtained was fired under a normal pressure at a temperature of 1300° C. for 5 hours in the air to obtain a zinc oxide sintered body in a disk-shaped form as a sputtering target.

The value of the (100) crystal orientation degree of the resulting zinc oxide sintered body was measured by an XRD. This measurement was performed by using an XRD equipment (product name "RINT-TTR III" manufactured by Rigaku Corporation) to measure an XRD profile upon X-ray irradiation on the surface of the zinc oxide sintered body in a disk-shaped form. The value of F representing the (100) crystal orientation degree is calculated by the following formulae. The value of F in the present Example was 0.55.

$$F = \frac{p - p_0}{1 - p_0} \quad \text{[Formula 2]}$$

$$p_0 = \frac{I_0(100)}{I_0(100) + I_0(002) + I_0(101) + I_0(102)}$$

$$p = \frac{I_s(100)}{I_s(100) + I_s(002) + I_s(101) + I_s(102)}$$

($I_0$(hkl) and $I_s$(hkl) respectively represent diffraction intensities from (hkl) planes (integrated value) in ICDD No. 361451 and a sample.

A cubic-shaped sample of which the one side was 5 mm was cut out from the disk-shaped zinc oxide sintered body to measure the average coefficient of thermal expansion in the temperature range from 25 to 1000° C. The coefficient of thermal expansion in the in-plane direction was $6.3 \times 10^{-6}$/° C., while the coefficient of thermal expansion in the thickness direction was $7.2 \times 10^{-6}$/° C.

The average grain diameter and the aspect ratio of the sintered body grains were measured in the following manner. In a sample having the same shape as that for measuring the coefficient of thermal expansion, after polishing a surface perpendicular to the disk plane and etching it with 0.3 M nitric acid for 10 seconds, an image of the sample was taken by a scanning electron microscope. The visual field range was chosen in such a manner that any straight lines, when drawn parallel and perpendicular to the disk plane, intersected 10 to 30 grains. In 3 straight lines drawn parallel to the disk plane, an average length of line segment passing through each grain was calculated in all grains that the straight lines intersected, and then was multiplied by 1.5 to give a value of $a_1$. Similarly, in 3 straight lines drawn perpendicular to the disk plane, the average length of line segment passing through each grain was calculated in all grains that the straight lines intersected, and then was multiplied by 1.5 to give a value of $a_2$. The aspect ratio and the average grain diameter were given as values of $a_1/a_2$ and $(a_1+a_2)/2$, respectively.

Another sintered body in a disk-shaped form (a sputtering target) produced in the same condition was bonded to a backing plate made of copper by means of indium, and placed in an RF magnetron sputtering equipment. In this RF magnetron sputtering equipment, sputtering was carried out for 30 minutes in pure Ar atmosphere at the pressure of 0.5 Pa with an input power of 150 W. As a result of performing sputtering on 5 targets, no break was found in any target.

Example 2

Figure 3:
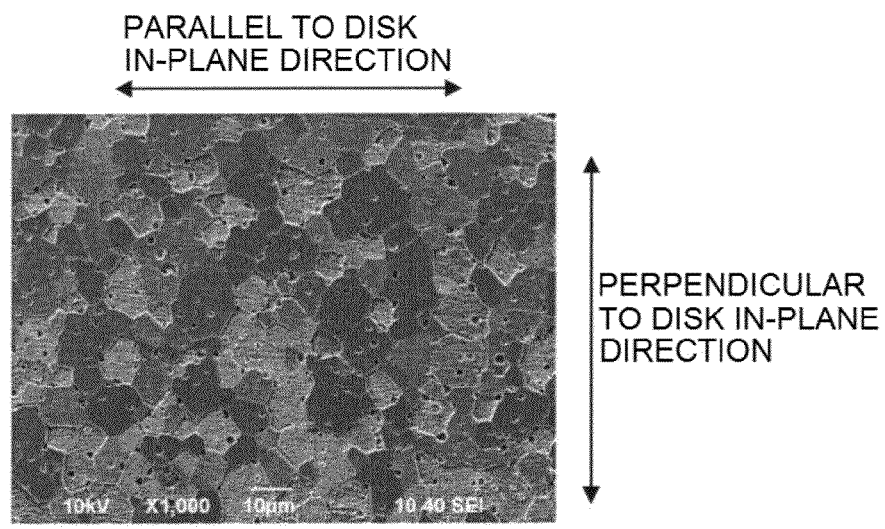
FIG. 3 is an SEM image of a cross section of a zinc oxide sintered body after polishing and etching taken in Example 2.
Figure 4:
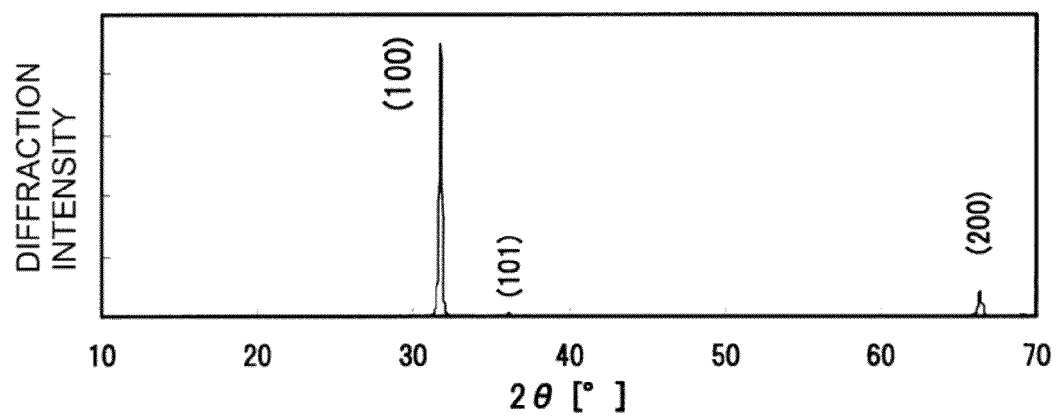
FIG. 4 is an XRD profile of a zinc oxide sintered body measured in Example 2.

Production of a target and sputtering thereon were carried out in the same manner as in Example 1, except that the amount of the dispersion medium in use was reduced to bring the slurry viscosity to 45000 cP. As a result, the orientation degree was increased to 0.97. An SEM image of a cross section of the zinc oxide sintered body after polishing and etching is shown in FIG. 3. As shown in FIG. 3, it can be understood that the plate-like zinc oxide particles of the raw powder grew to provide an isotropic crystal grain structure. An XRD profile of the zinc oxide sintered body is shown in FIG. 4. As shown in FIG. 4, the peak of diffraction intensity from the (100) crystal plane is significantly high, and thus it can be understood that the (100) crystal plane is highly oriented. There was no break in any of the 5 targets.

Example 3

Production of a target and sputtering thereon were carried out in the same manner as in Example 2, except that the firing temperature was 1200° C. There was no break in any target.

Example 4

Production of a target and sputtering thereon were carried out in the same manner as in Example 2, except that the firing temperature was 1350° C. There was no break in any target.

Example 5

To the composition described in Example 1, $\alpha$-$Al_2O_3$ having an average particle diameter of 0.4 μm in an amount of 2 parts by weight was added. The other conditions in production were the same as in Example 2. There was no break in any target. In the measurement of the particle diameter, microparticles (those having an inscribed circle diameter of 500 nm or less) presumed to be $ZnAl_2O_4$ phase was excluded.

Example 6 (Comparative)

A commercially available zinc oxide powder (manufactured by Seido Chemical Industry Co., Ltd., zinc oxide of JIS 1 grade, mean volume particle diameter D50 of 0.6 μm) was subjected to uniaxial pressing to produce a disk-shaped green compact, followed by isostatic pressing at a pressure of 2 tf/cm². After fired at a temperature of 1300° C. for 5 hours, a sintered body having the orientation degree of 0.02 was obtained. The sputtering was carried out in the same manner as in Example 1. As a result, break was found in all targets.

Example 7

The slurry prepared in Example 1 was used to prepare a sheet-like green compact having a thickness of 4 μm. The sheet-like green compact, without having been stacked in the form of layers, was degreased at a temperature of 650° C. for 20 hours and then fired at a temperature of 1300° C. for 5 hours to provide a zinc oxide sintered body in the sheet-like form. The resulting zinc oxide sintered body in the sheet-like form was coarsely crushed in a mortar, and subsequently pulverized in a ball mill to a mean volume particle diameter D50 of 20 μm so as to provide a plate-like zinc oxide powder. The plate-like zinc oxide powder thus obtained and the commercially available zinc oxide powder used in Example 6 were mixed in the ratio of 1:1 by volume, and the mixture was subjected to uniaxial pressing at a pressure of 200 kgf/cm² to produce a pressed green compact. The pressed green compact was fired at a temperature of 1350° C. for 5 hours to provide a sintered body. The resulting sintered body was used as a target to carry out sputtering in the same manner as in Example 1. As a result, break was found in one target among 5 targets.

The results obtained in Examples 1 to 7 are shown in Table 1.

TABLE 1

| Example | (100) orientation | Coefficient of thermal expansion in in-plane direction (1/° C.) | Coefficient of thermal expansion in thickness direction (1/° C.) | Grain aspect ratio | Average grain diameter (μm) | Break in target (number of incident/ total 5 targets) |
|---|---|---|---|---|---|---|
| 1 | 0.55 | $6.3 \times 10^{-6}$ | $7.2 \times 10^{-6}$ | 1.1 | 12 | 0 |
| 2 | 0.97 | $6.1 \times 10^{-6}$ | $7.6 \times 10^{-6}$ | 1.1 | 14 | 0 |
| 3 | 0.78 | $6.2 \times 10^{-6}$ | $7.3 \times 10^{-6}$ | 1.3 | 3.5 | 0 |
| 4 | 0.95 | $6.1 \times 10^{-6}$ | $7.6 \times 10^{-6}$ | 1.0 | 35 | 0 |
| 5 | 0.92 | $6.3 \times 10^{-6}$ | $7.6 \times 10^{-6}$ | 1.1 | 5 | 0 |
| 6 | 0.02 | $6.6 \times 10^{-6}$ | $6.6 \times 10^{-6}$ | 1.0 | 12 | 5 |
| 7 | 0.80 | $6.1 \times 10^{-6}$ | $7.4 \times 10^{-6}$ | 3.5 | 41 | 1 |

What is claimed is:

1. A zinc oxide sputtering target composed of a zinc oxide sintered body comprising zinc oxide crystal grains, wherein the zinc oxide sputtering target has a sputter surface having a (100) crystal orientation degree of 50% or more.

2. The zinc oxide sputtering target according to claim 1, wherein the crystal orientation degree is 75% or more.

3. The zinc oxide sputtering target according to claim 1, wherein the crystal grains have an aspect ratio of 2.0 or lower in a cross section perpendicular to the sputter surface.

4. The zinc oxide sputtering target according to claim 3, wherein the aspect ratio is 1.5 or lower.

5. The zinc oxide sputtering target according to claim 1, wherein the zinc oxide crystal grains have an average grain diameter of 1 to 50 μm.

6. A method for producing a zinc oxide sputtering target comprising the steps of:

providing a plate-like zinc oxide powder having a mean volume particle diameter D50 of 0.1 to 1.0 μm;

orienting the plate-like zinc oxide powder by a method utilizing shearing stress to obtain a crystallographically oriented green compact; and firing the crystallographically oriented green compact at a temperature of 1000 to 1400° C. to obtain the zinc oxide sputtering target composed of a zinc oxide sintered body comprising zinc oxide crystal grains that are oriented, wherein the zinc oxide sputtering target has a sputter surface having a (100) crystal orientation degree of 50% or more.

7. The method according to claim 6, wherein the method utilizing shearing stress is at least one selected from the group consisting of tape casting, extrusion molding, and doctor blade method.

8. The method according to claim 6, wherein the method utilizing shearing stress is carried out by preparing a slurry from the plate-like zinc oxide powder and passing the slurry through a discharge port to obtain the crystallographically oriented green compact in a sheet-like form.

9. The method according to claim 8 further comprising, prior to the firing, the steps of preparing a plurality of the sheet-like crystallographically oriented green compacts; stacking the sheet-like crystallographically oriented green compacts on top of each other to provide a precursor laminate; and subjecting the laminate precursor to a press molding.

10. The method according to claim 6, wherein the step of providing the plate-like zinc oxide powder comprises adding an alkali aqueous solution to a zinc salt aqueous solution to provide a mixture; stirring the mixture at a temperature of 60 to 95° C. for 2 to 10 hours to form a precipitate; and subjecting the precipitate to washing, drying and pulverization.

11. The method according to claim 10, wherein the pulverization is performed for 1 to 10 hours by using a ball mill.

* * * * *